United States Patent [19]

Temer

[11] Patent Number: 4,600,903
[45] Date of Patent: Jul. 15, 1986

[54] GAIN CONTROL COMPENSATION FOR BANDPASS FILTER WITH VARIABLE BANDWIDTH

[76] Inventor: Vladan Temer, 2141 Sunrise Ave., Santa Rosa, Calif. 95402

[21] Appl. No.: 644,741

[22] Filed: Aug. 27, 1984

[51] Int. Cl.$^4$ .............................................. H03H 7/03
[52] U.S. Cl. ................................... 333/177; 333/178; 333/174; 333/186
[58] Field of Search ............... 333/167, 172, 177, 178, 333/174, 186, 187; 330/277

[56] References Cited

U.S. PATENT DOCUMENTS

| | | | |
|---|---|---|---|
| 3,680,011 | 7/1972 | Adams et al. | 333/167 |
| 3,883,833 | 5/1975 | Ozone et al. | 333/167 |
| 4,135,132 | 1/1971 | Tafjord | 333/167 |
| 4,306,200 | 12/1981 | Takayama | 330/277 |

FOREIGN PATENT DOCUMENTS 2071453  8/1981  United Kingdom ............... 333/177

*Primary Examiner*—Eugene R. LaRoche
*Assistant Examiner*—Benny Lee
*Attorney, Agent, or Firm*—Douglas L. Weller

[57] ABSTRACT

A bandpass filter is presented which is constructed so that bandwidth of the bandpass filter may be varied without varying gain from an input signal to an output signal when the input signal is at a center frequency. A crystal resonator is connected in series with a compensation resistance, and a variable resistance. Ignoring shunt capacitance, the crystal resonator may be modelled by a capacitance, an inductance and a loss resistance coupled in series. The compensation resistance is chosen so that the voltage drop across the compensation resistance is equal to the voltage drop across the loss resistance. A transformer having a primary coil, a secondary coil, and a 1:1 turn ratio between the two coils is included in the circuit. The primary coil is coupled in parallel with the compensation resistance. The output signal appears at an output of the secondary coil.

5 Claims, 5 Drawing Figures

GAIN CONTROL COMPENSATION FOR BANDPASS FILTER WITH VARIABLE BANDWIDTH

BACKGROUND

Certain applications for bandpass filters require variation of filter bandwidth without attendant variation in gain. FIG. 1 shows a signal source 11 connected to a prior art bandpass filter 39 and to a reference voltage source 10. Signal source 11 generates a signal $S_{in}$ which has a signal voltage $V_i$. Bandpass filter 39 includes a crystal resonator 32 and a variable resistance 33. A signal $S_{out}$ having a voltage $V_o$ appears on an output node 16.

As shown in FIG. 2, crystal resonator 32 may be modelled (neglecting shunt capacitance) as an inductor 45, a capacitance 46 and a resistance 47 (the magnitude of resistance 47 is referred to in the formulae herein as $R_{47}$) connected together in series.

Varying resistance 33 varies the bandwidth of bandpass filter 39, but also varies the passband gain $(V_o/V_i)$ of filter 39 because of voltage division between resistance 47 and resistance 33. A first prior art method which allows the variance of resistance 33 without varying the passband gain requires generating a signal source with a negative source resistance. The negative source resistance has a magnitude in ohms of negative $R_{47}$, thus cancelling resistance 47. A second prior art method requires amplifying the signal before or after filter 39, the amount of amplification being a function of the value of resistance 33.

Both the aforementioned prior art methods have drawbacks. The first method requires negative source resistance, thus requiring positive feedback. Positive feedback may multiply noise and distortion thus degrading the performance of bandpass filter 39. The second method requires a variable gain amplifier which must be able to automatically adjust its gain as the magnitude of resistance 33 varies.

SUMMARY OF THE INVENTION

In accordance with the preferred embodiment of the present invention, a bandpass filter is presented. The bandpass filter is constructed so that bandwidth of the bandpass filter may be varied without varying signal gain from filter input to filter output when the input signal is at center frequency ($f_c$). A crystal resonator is connected in series with a sensing resistance and a variable resistance. Ignoring shunt capacitance, the resonator crystal may be modelled by a capacitance, an inductance and a loss resistance coupled in series. The compensation resistance is chosen so that the voltage drop across the compensation resistance is equal to the voltage drop across the loss resistance. A transformer having a primary coil, a secondary coil, and a 1:1 turn ratio between the two coils is included in the circuit. The primary coil is connected in parallel with the compensation resistance. The output signal appears at an output of the secondary coil.

DESCRIPTION OF THE PREFERRED EMBODIMENTS

Figure 1:
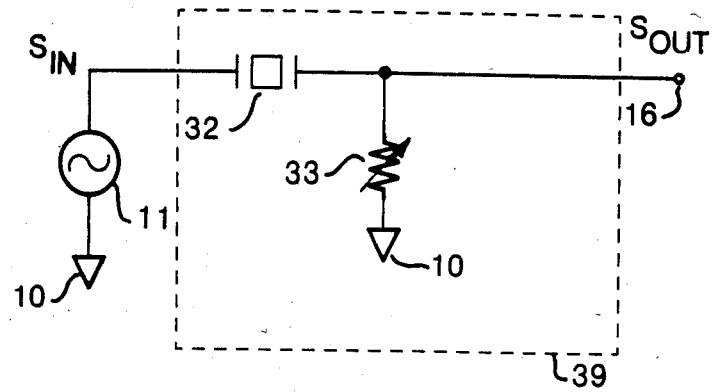
FIG. 1 shows a prior art bandpass filter.
Figure 2:
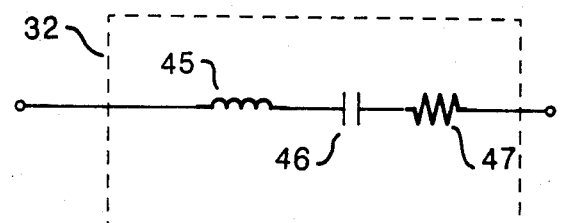
FIG. 2 shows a simplified equivalent circuit of a crystal resonator.
Figure 3:
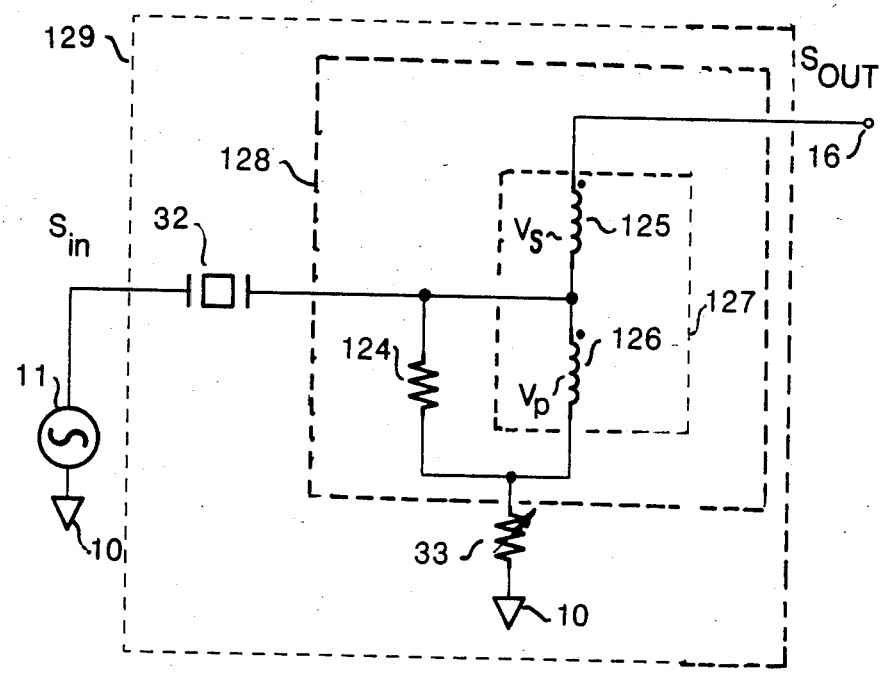
FIGS. 3, 3A and 4 show a bandpass filter in accordance with a preferred embodiment of the present invention.

FIG. 3 shows signal generator 11 connected to a bandpass filter 129. Bandpass filter 129 is similar to bandpass filter 39, except for the addition of a circuit component 128, as shown. Circuit component 128 comprises a resistance 124 (the magnitude of resistance 124 is referred to in formulae herein as $R_{124}$) and a transformer 127 connected as shown. Transformer 127 comprises a primary coil 126 and a secondary coil 125 with a turn ratio of 1:1. A secondary voltage $V_s$ across secondary coil 125 is equal to a primary voltage $V_p$ across primary coil 126. Primary voltage $V_p$ is also equal to the voltage drop across resistance 124. As can be derived, the passband gain $(V_o/V_i)$ will be unity when resistance 124 is equal to resistance 47 of crystal resonator 32; that is, when:

$$R_{124} = R_{47}$$

Figure 3A:
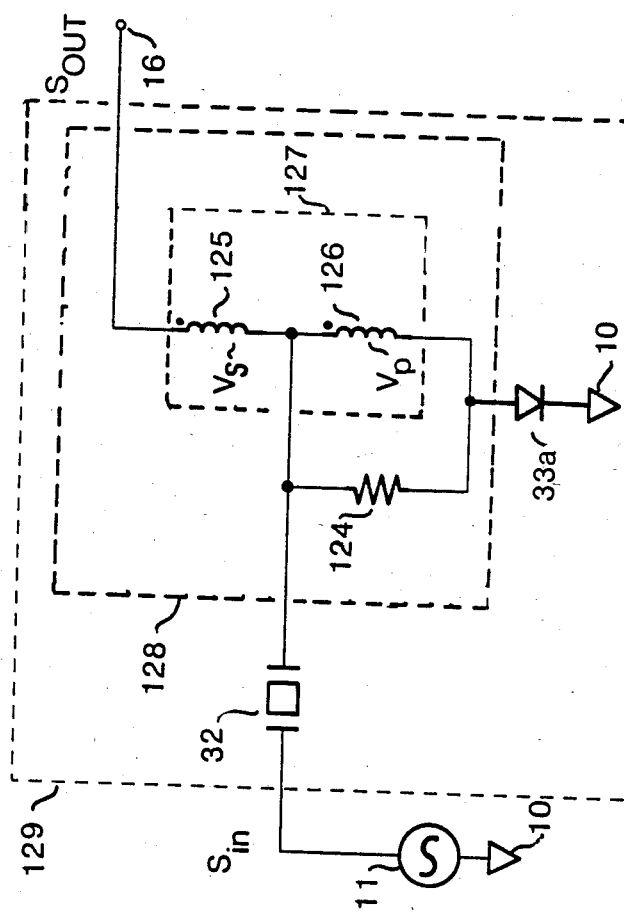

Thus in the preferred embodiment, resistance 33 will only affect the bandwidth of filter 129 but not its passband gain $(V_o/V_i)$. Variable resistance 33 may be replaced by a pin diode 33a as shown in FIG. 3A.

Figure 4:
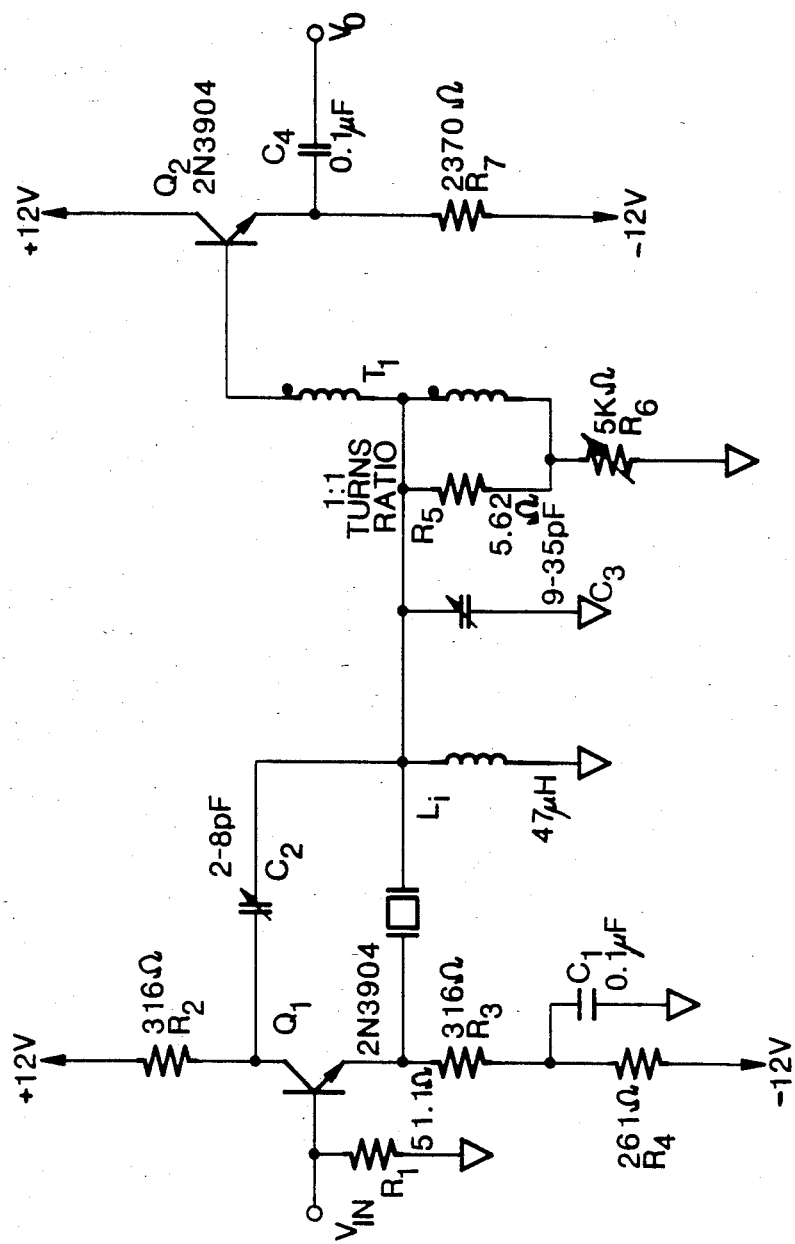

FIG. 4 is a schematic of an embodiment of bandpass filter 129 which shows actual values for circuit components when the center frequency of bandpass filter 129 is 3 megahertz (MHz).

I claim:

1. A device, having an input and an output, for filtering an input signal, the device comprising:

passing means for receiving the input signal present at the device input and passing a frequency band within the input signal, the passing means having an input, an output and an impedance which includes a first resistance, the impedence being coupled between the input and the output, wherein the input signal at the device input is coupled to the passing means input and a second signal appears at the passing means output;

first resistive means having a first end and a second end, the first end being coupled to the output of the passing means, for producing a voltage drop between the first end and the second end which is proportional to the voltage loss across the first resistance;

a transformer, having a primary coil and a secondary coil, the primary coil including a first coil end coupled to the first end of the first resistive means and a second coil end coupled to the second end of the first resistive means, the secondary coil including a first secondary coil end coupled to the first coil end of the primary coil and the secondary coil including a second secondary coil end coupled to the output of the device, wherein there appears across the first secondary coil end and the second secondary coil end a compensating voltage for compensating for the voltage loss across the first resistance; and passband width varying means coupled to the second coil end of the primary coil of the transformer for varying the bandwidth of the frequency band passed by the passing means.

2. A device as in claim 1 wherein the passband width varying means is a pin didoe.

3. A device as in claim 1 wherein the impedence comprises a resonator crystal.

4. A device, having an input and an output, for filtering an input signal, the device comprising:
   passing means for receiving the input signal present at the device input and passing a frequency band within the input signal, the passing means having an input, an output and an impedance which includes a first resistance, the impedence being coupled between the input and the output, wherein the input signal at the device input is coupled to the passing mens input and a second signal appears at the passing means output;
   first resistive means having a first end and a second end, the first end being coupled to the output of the passing means, for producing a voltage drop between the first end and the second end which is proportional to the voltage loss across the first resistance;
   a transformer, having a primary coil and a secondary coil, the primary coil including a first coil end coupled to the first end of the resistive means and a second coil end coupled to the second end of the resistive means, the secondary coil including a first secondary coil end coupled to the first coil end of the primary coil and the secondary coil including a second seocndary coil end coupled to the output of the device, wherein there appears across the first secondary coil end and the second secondary coil end a compensating voltage for compensating for the voltage loss across the first resistance;
   a reference voltage; and
   second resistive means for setting the bandwidth of the passing means, the second resistive means having a first end coupled to the second end of the first resistive means, and a second end coupled to the reference voltage.

5. A device as in claim 4 wherein the second resistive means is a variable resistor.

* * * * *

UNITED STATES PATENT AND TRADEMARK OFFICE
CERTIFICATE OF CORRECTION

PATENT NO. : 4,600,903

DATED : July 15, 1986

INVENTOR(S) : Vladan Temer

It is certified that error appears in the above-identified patent and that said Letters Patent is hereby corrected as shown below:

Column 3, line 2, reads "pin didoe", should read -- pin diode --.

Column 4, line 8, reads "second seocndary", should read
    -- second secondary --.

Signed and Sealed this

Seventh Day of October, 1986

[SEAL]

Attest:

DONALD J. QUIGG

Attesting Officer

Commissioner of Patents and Trademarks